United States Patent [19]
Natarajan et al.

[11] Patent Number: 5,746,874
[45] Date of Patent: May 5, 1998

[54] APPARATUS AND METHOD FOR FORMING CAVITY SUBSTRATES USING FLEXIBLE PREFORM INSERT

[75] Inventors: Govindarajan Natarajan, Pleasant Valley; Robert William Pasco, Wappingers Falls, both of N.Y.

[73] Assignee: International Business Machines Corporation, Armonk, N.Y.

[21] Appl. No.: 537,319

[22] Filed: Sep. 29, 1995

[51] Int. Cl.$^6$ ........................................... B32B 35/00
[52] U.S. Cl. ................... 156/285; 156/289; 156/323; 156/382; 156/580; 425/405.1; 425/500
[58] Field of Search ..................... 156/89, 156, 285, 156/289, 323, 497, 580, 382; 264/241, 313, 316, 101, 102, DIG. 50, DIG. 57, DIG. 64, DIG. 65; 425/500, 502, 504, 508, 520, 521, 111, 405.1, 405.2, 406

[56] References Cited

U.S. PATENT DOCUMENTS

| | | | |
|---|---|---|---|
| 4,024,629 | 5/1977 | Lemoine et al. | 29/625 |
| 4,636,275 | 1/1987 | Norell | 156/289 |
| 4,680,075 | 7/1987 | Mcmneal et al. | 156/289 |
| 4,734,155 | 3/1988 | Tsunoda et al. | 156/583.1 |
| 4,737,208 | 4/1988 | Bloechle et al. | 156/90 |
| 4,824,509 | 4/1989 | Tonoki et al. | 156/285 |
| 4,833,000 | 5/1989 | Trickett et al. | 428/137 |
| 4,946,640 | 8/1990 | Nathoo | 264/316 |
| 5,108,532 | 4/1992 | Thein et al. | 156/285 |
| 5,116,440 | 5/1992 | Takeguchi et al. | 156/90 |
| 5,240,671 | 8/1993 | Carey | 419/9 |
| 5,370,760 | 12/1994 | Mori et al. | 156/89 |
| 5,435,875 | 7/1995 | Saitoh et al. | 156/89 X |
| 5,478,420 | 12/1995 | Gauci et al. | 156/89 X |
| 5,538,582 | 7/1996 | Natarajan et al. | 156/89 X |

FOREIGN PATENT DOCUMENTS

93/25385  12/1993  WIPO ................. 156/89 X

*Primary Examiner*—Curtis Mayes
*Attorney, Agent, or Firm*—Aziz M. Ahsan

[57] ABSTRACT

The present invention relates generally to a new apparatus and method for forming cavities in semiconductor substrates using at least one flexible preform insert. More particularly, the invention encompasses apparatus and method for fabricating cavities in MLC (multi-layer ceramic) substrates using at least one flexible preform insert that is inserted into the cavity of the MLC substrate prior to lamination and this insert helps in preventing the collapse of the shelves of the cavity during this lamination process. After the lamination process the inventive temporary preform insert is then removed.

30 Claims, 3 Drawing Sheets

APPARATUS AND METHOD FOR FORMING CAVITY SUBSTRATES USING FLEXIBLE PREFORM INSERT

CROSS-REFERENCE TO RELATED PATENT APPLICATIONS

This patent application is related to U.S. patent application Ser. No. 08/530,499, filed on Sep. 19, 1995, entitled "Method For Forming Multiple Cavity Products", and U.S. patent application Ser. No. 08/530,500, filed on Sep. 19, 1995, entitled "Apparatus For Forming Multiple Cavity Products", presently assigned to the assignee of the instant patent application, and the disclosure of both of which are incorporated herein by reference.

FIELD OF THE INVENTION

The present invention relates generally to a new apparatus and method for forming cavities in semiconductor substrates using at least one flexible preform insert. More particularly, the invention encompasses apparatus and method for fabricating cavities in MLC (multi-layer ceramic) substrates using at least one flexible preform insert that is inserted into the cavity of the MLC substrate prior to lamination and this insert helps in preventing the collapse of the shelves of the cavity during this lamination process. After the lamination process the inventive temporary preform insert is then removed.

BACKGROUND OF THE INVENTION

Semiconductor substrates and devices are becoming smaller and more dense with the evolution of new technologies. However, increases in circuit density produces a corresponding increase in overall manufacturing problems. These manufacturing problems must however be kept to a minimum in order for the semiconductor manufacturer to remain competitive. The semiconductor manufacturers are therefore constantly being challenged to improve the quality of their products by identifying and eliminating defects which produce defective parts or components. Whereas significant improvements are being made to eliminate systematic defects by reducing process variability. Process improvements alone are not sufficient to eliminate all the random defects which effect both yield and reliability. Historically, screening techniques have been employed to improve product failure rates to acceptable levels by culling out many of these random defects.

In their desire to improve their products the semiconductor manufacturers are constantly finding new ways and new techniques to improve or provide new products. It has been found that for some applications one could make a ceramic carrier or substrate having a cavity and then have the semiconductor chip placed inside the cavity and secured to the semiconductor substrate. These semiconductor substrates are often referred to as modules. These modules could be made from a single ceramic layer or green sheet forming a single layer ceramic module or a plurality of ceramic layers forming a MLC (multilayer ceramic) module.

These MLC modules having single or multiple cavities are normally used in the electronic industry to package high performance integrated circuits or chips. These high performance integrated circuits chips have large number of external input/output points, such as, pads, solder balls, to name a few, and these chips have a very high power dissipation. In order to accommodate such high performance chips the MLC substrate or module also have to provide high number of external input/output points, such as, pads, pins, to name a few, and also be able to handle the very high power dissipation that is being generated both from the module as well as the chip.

The single or multiple cavities in a MLC module are normally formed during the lamination process using typically a hard or a soft insert as a plug. This plug in turn prevents the collapse or deformation of the stacked green ceramic body or sheet during lamination. This method of producing single or multiple cavities requires machining of the inserts with high precision and with high level of surface finish.

Inherently, the cost of such inserts or plugs is very high. Additionally, these inserts or plugs do not provide the flexibility of using the same inserts for cavities of various shapes and sizes. Furthermore, placing these inserts and then subsequently removing them is an expensive process and many times this could lead to the delamination of the ceramic green sheets. Another drawback with these solid inserts is the need to clean them prior to every use to avoid the paste pull-outs or damage to the green ceramic layers.

Another method of producing these single or multiple cavities in the MLC module would be to machine the cavities after the green sheets have been laminated, but this would not be a cost effective way of producing parts in a high volume manufacturing operation.

It is also possible to form cavities in the MLC module with no inserts. This could be done for cases where the lamination conditions are such that there is no resulting deformation in green ceramic sheet or body. In these cases, typically, the lamination pressures are very low and the green sheet formulation is such that the dimensional control of products is achieved by altering the sintering process. However, in high volume manufacturing operation, tailoring the green sheet formulation and developing a sinter cycle for every product would be cost prohibitive and time consuming. Besides, this approach typically needs an adhesive between layers and multiple lamination steps to achieve the end result. Thus, some of the problems associated with this low pressure lamination process are that no process window for dimensional control is available for the sintered body. Delamination of the ceramic layer could happen in sintering due to the removal of the adhesive and the density gradients in the starting structure that are normally present could result in poor substrate dimensional control. Furthermore, there could be substantial increase in stacking and lamination cost and limitation in metal loading on the green sheets to have effective green sheet bonding.

In order to better understand the related art, the art could be broadly grouped into three general categories. The first being the art that is directed to shaping of an object by material deformation. The second being the art that deals with formation of non-planar and non-deformable objects by using cavity fills. While, the third art group could be one that deals with planar objects.

The following references could be classified under the first group which deals with deformation and shaping of a planar object.

U.S. Pat. No. 4,946,640 (Nathoo) shows that the deformation of the material could be accomplished by using a mold of desired contours. In this patent air is used as the lubricant and release agent to separate the preformed material from the mold.

U.S. Pat. No. 5,108,532 (Thein) shows that the deformation of a planar object could be accomplished by applying air on one side and vacuum on the other side.

The following references could be generally classified under the second group which deals with non-planar and non-deformable objects. However, this art group could be further divided into two unique sub-groups, where the first sub-group would be dealing with a non-planar lamination using solid insert, and the second sub-group would be dealing with a non-planar and non-deforming lamination with no inserts.

The following references could be classified in this first sub-group of non-planar lamination using solid insert.

U.S. Pat. No. 4,024,629 (Lemoine) shows that fugitive paste could be used as a cavity fill to prevent deformation during lamination.

U.S. Pat. No. 4,680,075 (McNeal) shows that a thermoplastic plug could be used to fit snugly inside a cavity as a cavity fill.

IBM Technical Disclosure Bulletin, Phillips, Vol. 16, No. 11, Pages 3559 (April 1974) shows that a metal insert could be used to fill a cavity.

The following references could be classified in the second sub-group of non-planar and non-deforming lamination with no inserts.

Both, U.S. Pat. No. 4,636,275 (Norell) and No. 4,824,509 (Tonoki) teach how to laminate a non-planar object with a non-deforming cavity by using a bag/bladder/elastomer separating the liquid applying the force from the object to be laminated.

Finally, following is a reference that could be classified in the third group that deals with planar objects.

U.S. Pat. No. 4,734,155 (Tsunoda) teaches the use of a mechanical device to apply pressure to the lamination plates.

All cavity lamination methods described above can also be further classified into three general groups depending on the manner in which they interact with the body being laminated. The first group could be the use of solid inserts to fabricate cavities that are planar with the laminating surface since the inserts themselves need to conform to the laminating surface.

The second group could be the use of a fluid and membrane to laminate the multilayer ceramic assembly that does not have to conform to any surface since the fluid applying the pressure distributes the force uniformly over the cavity surface.

The third group could include the use of fugitive paste which does conform to the laminating surface wherever there is no fugitive paste; but it does not need to conform to the laminating surface within the cavity region since the paste can have low viscosity relative to the viscosity of the multilayer ceramic body during the lamination process.

One of the problems that arises when fabricating cavities using one of the first group methods is the removal of the solid object or insert that was used to prevent the cavity collapse prior to the sintering process. Removal of a solid object from an unsintered ceramic body can cause layer separation or other mechanical damages to the unfired ceramic. Also, since the solid plug or insert used does not compress itself during the lamination process as the unfired ceramic body does, it is possible to create damage to the metallurgy or the ceramic module prior to sintering.

The use of a liquid and a membrane to laminate a cavity as expected from the methods described in the second group can eliminate most of the mechanical problems experienced with the first group methods; however, there are other new problems associated with the use of the second group method. The first being that it is possible to rupture the membrane and get the fluid to contaminate the multilayer ceramic assembly. And, the second is that it is difficult to maintain planarity on the cavity surface when the metal distribution within the package is not uniform prior to the lamination stage.

U.S. Pat. No. 5,240,671, teaches the formation of cavities and protrusions by using a mold and green slurry. The metallization is done after the slurry dries.

U.S. Pat. No. 4,946,640, teaches the use of a mold to obtain the desired contour. The object molded has uniform thickness, but shaped to match the contours of the mold. The object is then released using AIR from the mold.

U.S. Pat. No. 4,833,000, teaches the stacking of green sheets with cavity holes cut in appropriate layers. Then the cavity hole is filled with molten wax (potential for layer distortion, delamination, contamination, yield and reliability problems) and pressed and sintered to remove the wax.

U.S. Pat. No. 4,680,075, teaches about using thermoplastic plug with surface not sticking to dielectric layers.

U.S. Pat. No. 4,737,208, U.S. Pat. No. 5,116,440 and U.S. Pat. No. 4,636,275, all disclose the use of a release layer (or a barrier) between the green laminate and the flowable plug in the cavity. The release material is claimed as non-sticky or peelable, elastic and in general elongation >200 percent and yield strength of <1.8 MPa.

In every cavity formation technique, it is essential that the material set is chosen such that a cavity profile with sharp corners and flat wire bonding shelves is achieved. When soft inserts and membranes are used, usually it results in rounded edges and corners, and sloped wire bond shelves usually is the result. The present invention however solves these problems.

The present invention primarily deals with the formation of cavities in multi-layer ceramic (MLC) modules or substrates, with or without the use of inserts during lamination process.

Basically, this invention teaches a method to laminate a non-planar object with no cavity deformation by using a preform membrane. The preform is made of a low elongation and high modulus material. The low elongation and non-elastic behavior of the preform insert helps to retain the preform shape. High modulus property of the membrane helps to smooth the screened features and attain the sharp cavity profile requirement.

PURPOSES AND SUMMARY OF THE INVENTION

The invention is a novel method and apparatus for forming cavities using an inventive preform insert.

Therefore, one purpose of this invention is to provide an apparatus and a method that will form cavities in a semiconductor substrate using an inventive preform insert.

Another purpose of this invention is to provide an apparatus and a method that will form cavities in a multi-layer ceramic using an inventive preform insert.

Still another purpose of this invention is to have an apparatus and a method for forming cavities in a multi-layer ceramic substrate that is very economical.

Yet another purpose of this invention is to provide an apparatus and a method for forming cavities in a multi-layer ceramic substrate that is predictable and repeatable.

Still another purpose of this invention is to form cavities in several products simultaneously, but with a single lamination process.

Yet another purpose of this invention is to provide a flexible apparatus and a method for forming cavities using isostatic or uniaxial lamination process.

Still yet another purpose of this invention is to provide an apparatus and a method for forming cavities in multi-layer ceramic substrates with high degree of yield using the inventive solid flexible preform insert of this invention.

Therefore, in one aspect this invention comprises a method of forming a ceramic substrate having at least one cavity, comprising the steps of:

(a) placing at least one ceramic layer having at least one cavity over a first plate, wherein said cavity forms a female portion in said ceramic layer, (b) placing at least one preform insert having at least one cavity over said ceramic layer, wherein said cavity in said preform insert forms a male portion and a female portion, such that the male portion of the preform insert mates with the cavity of the ceramic layer and the surface of the male portion of said preform insert follows the contours of at least a portion of said cavity of said ceramic layer, (c) placing a second plate having at least one opening over at least a portion of said at least one preform insert, (d) pressurizing at least a portion of said second plate so that said first and second plates come closer and laminating said at least one ceramic layer, and whereas said male portion of said preform insert prevents the collapse of the cavity of said ceramic layer, and thereby forms a ceramic substrate having at least one cavity.

In another aspect this invention comprises an apparatus for forming cavities in at least one ceramic layer of a ceramic substrate comprising, a first plate to accommodate said at least one ceramic layer having at least one opening and said opening acting as a female portion, at least one preform insert having at least one male portion, wherein said male portion of said preform is inserted into at least a portion of said female portion of said at least one ceramic layer, a second plate having at least one opening over at least a portion of said at least one male portion of said preform insert, at least one external pressure application means over said second plate, whereupon the application of said at least one external pressure on said male portion prevents the collapse of said female portion in said substrate and thereby forms said at least one ceramic layer having at least on cavity.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

This invention comprises method and apparatus of forming cavities in a ceramic substrate using an inventive insert. Basically, a plurality of green ceramic layers having at least one cavity are placed over a metal plate. The preform insert of this invention is then placed over at least a portion of the cavity. A second plate having at least one opening is then placed over at least a portion of the preform insert. Pressure and constant heat is then applied and a substrate with a well defined cavity is then formed. It is preferred that the applied pressure is isostatic, however, for some application other types of pressure means could be used, such as, uniaxial pressure, hydrostatic pressure, pneumatic pressure, to name a few. For some situations it would be preferred to place the multi-layered ceramic material in a thermoplastic and heat sealable bag. The bag is sealed along with its contents under vacuum.

Figure 1:
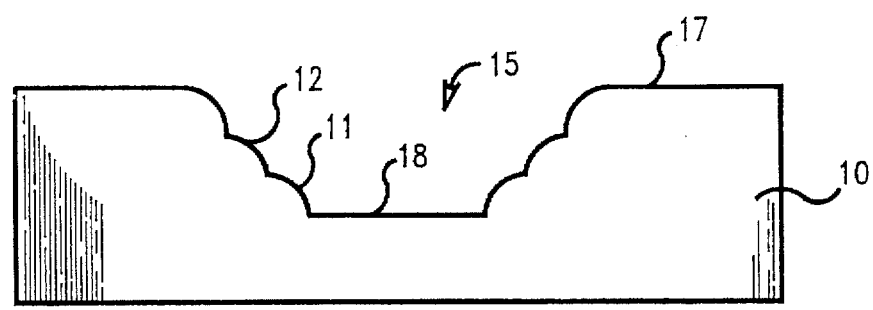
FIG. 1, illustrates a multi-layer ceramics substrate having a cavity with deformed shelves which was made using one of the apparatus and/or method of the prior art.

FIG. 1, illustrates a multi-layer ceramics substrate 10, having a cavity 15, with deformed shelves 11 and 12, which was made using one of the apparatus and/or method of the prior art. Individual ceramic tiles or green sheets are used to build the Multi-Layered Ceramic (MLC) substrate or module 10. These green sheet ceramic layers are typically fabricated using a tape casting process, which is well known in the art. First, large rolls or sheets of ceramic green sheet layers are produced, then individual layers or tiles are punched out of these large rolls or sheets of ceramic layers. Subsequently, individual ceramic layers that will form a cavity 15, are also blanked or a hole is punched appropriately to form the ceramic layers with cavity 15.

Typically, the material for the ceramic layer is selected from a group comprising alumina, alumina with glass frits, aluminum nitride, borosilicate and glass ceramic, to name a few.

Wiring metallurgy, which is also well known in the art, is then applied through standard process onto one or more surfaces of the individual ceramic layers and blanked ceramic layers or the ceramic layer with holes. Typically, a plurality of multi-layer ceramics (MLC) having cavities are then laminated to form a MLC substrate. Area 18, typically is dedicated for the attachment of a semiconductor chip, while area 17, is the upper surface of the cavity substrate 10. The shelves 11 and 12, typically have pads for electrical connection to the chip which is secured to the area 18.

Figure 2A:
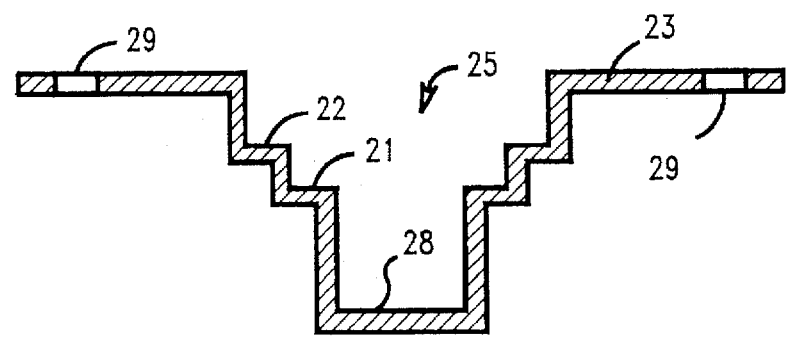
FIG. 2A, illustrates a side-view of the preferred embodiment of a flexible preform insert used to form at least one cavity in a multi-layer ceramic substrate.

FIG. 2A, illustrates a side-view of the preferred embodiment of a flexible preformed insert 23, used to form at least one cavity 15, in a multi-layer ceramic substrate 10. The insert 23, has a cavity 25, having shelves 21 and 22, which shelves are used to prevent the collapsing of the shelves 11 and 12, respectively, during the MLC lamination process. The insert 23, preferably should have alignment holes or openings 29.

Figure 2B:
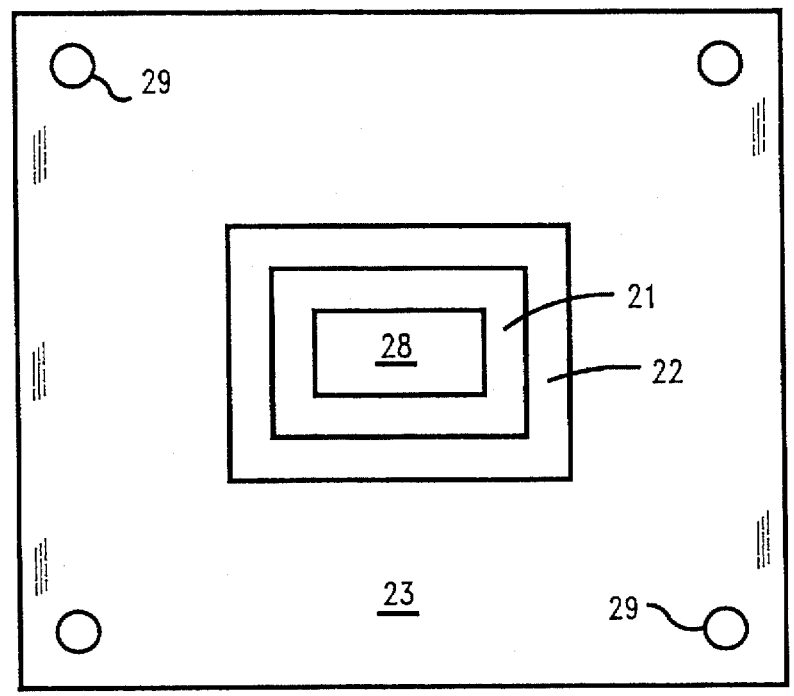
FIG. 2B, illustrates a top view of the preferred embodiment of the invention of FIG. 2A.

FIG. 2B, illustrates a top view of the preferred embodiment of the invention of FIG. 2A, where it can be clearly seen that the shelves 21 and 22, and the base area 28, have to have sharp features in order to preserve the collapse of the corresponding area, i.e., shelves 11 and 12, and chip area 18, respectively, on the module 10.

Figure 3:
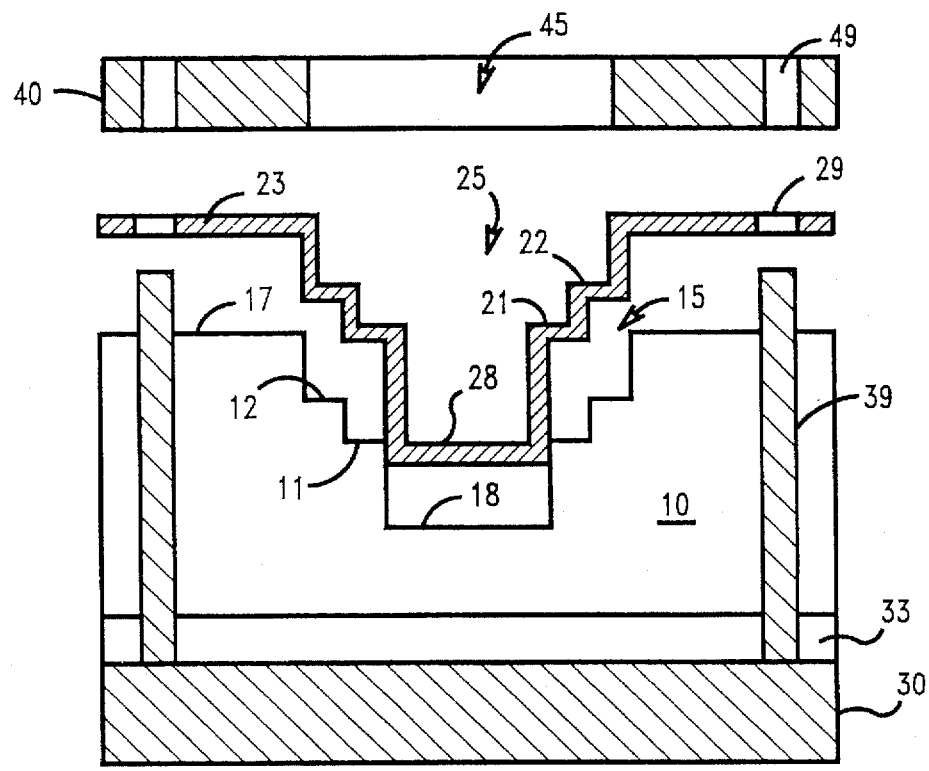
FIG. 3, illustrates a side view of the inventive insert of FIG. 2A, being used to preserve the cavity of a multilayer ceramic substrate during lamination.

FIG. 3, illustrates a side view of the inventive preform insert 23, of FIG. 2A, being used to preserve the cavity 25, of a multilayer ceramic substrate 10. On a platen 30, preferably a metal platen 30, having at least one alignment pin 39, it is preferred that at least one non-sticking sheet of separator material 33, that does not stick either to the surface of the first flat plate 30, or to the bottom surface of the ceramic layer 10, is placed between the upper surface of the first solid flat plate 30, and the first ceramic sheet of the module 10. This non-sticking material 33, will further ensure that under pressure the first ceramic sheet of the module 10, does not adhere or stick to the surface of the first flat plate 30. The purpose of the separator sheet 33, is basically, to prevent the adhesion of the substrate 10, to the platen 30.

Thereafter, a plurality of green sheet layers that form the substrate 10, are placed over the separator sheet 33. Preformed flexible or semi-flexible or rigid insert 23, is then inserted into the cavity 15, as shown in FIG. 3. For optimum results care should be taken that the contours of the insert 23, perfectly follow the contours of the cavity 15, and the surface 17, of the module, otherwise during the lamination process, when force is applied, the cavity or a portion thereof could collapse or deform or an imprint of the insert 23, might take place on the surface of the module 10. An upper or second platen 40, having at least one alignment opening or hole 49, and at least one cavity opening 45, is then placed as shown in FIG. 3.

This whole assembly, as shown in FIG. 3, can now be laminated, by methods well known in the art, in order to form the module 10, with at least one cavity 15, with well defined shelves. For example, isostatic pressure could be applied by placing the whole assembly in a fluid, such as, water, or gas, such as, nitrogen or air, and then pressure is applied from all sides in order to laminate the ceramic layers of the module 10. Care should be taken during this lamination process that the fluid employed does not interact or degrade the ceramic laminate. For some applications it would also be preferred to heat the assembly during this pressurization or lamination process.

Figure 4:
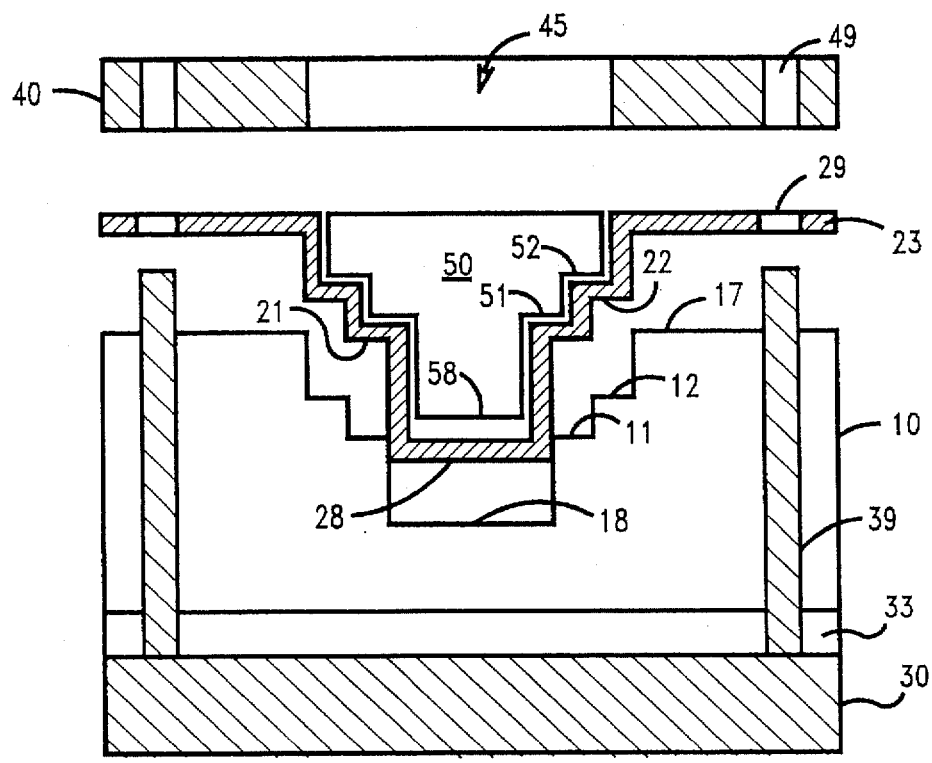
FIG. 4, illustrates a side view of the inventive insert of FIG. 2A, being used in conjunction with a solid insert to preserve the cavity of a multilayer ceramic substrate during lamination.

FIG. 4, illustrates a side view of the inventive insert 23, of FIG. 2A, being used in conjunction with a solid insert 50, to preserve the cavity 15, of a multilayer ceramic substrate 10. The process is basically the same as discussed in conjunction with FIG. 3, except that the solid insert 50, having base 58, and shelves 51 and 52, which correspond to the base 28, and shelves 21 and 22, respectively, of the insert 23, is inserted into the cavity 25, to prevent the cavity 25, from collapsing or to reinforce the insert 23, which is used to form the cavity 15.

Figure 5:
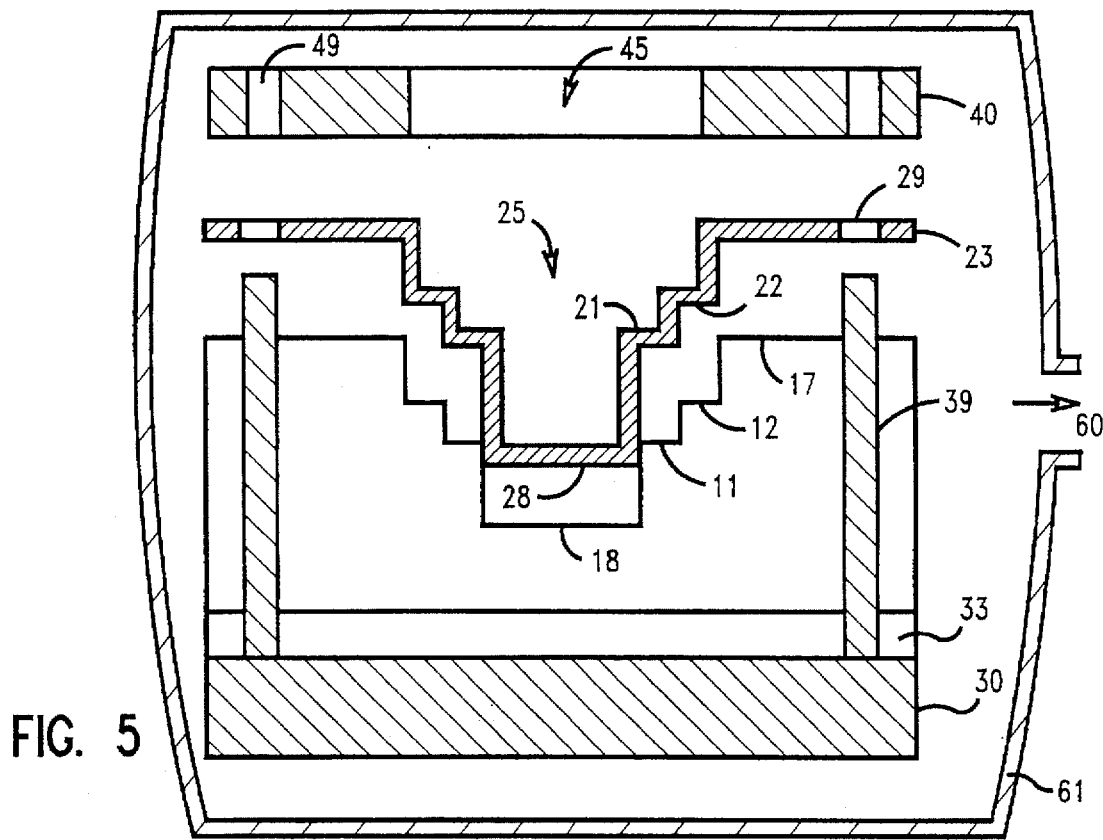
FIG. 5, illustrates a side view of another embodiment with the invention.

FIG. 5, illustrates a side view of another embodiment of the invention, where at least one environmental enclosure 61, is used to cover or protect the assembly of FIG. 3. The enclosure 61, could have an opening 60, to a port or to a similar other feature, such as, to provide vacuum or some kind of a foreign media, such as gases or other fluids. The enclosure 61, could be rigid or flexible.

Figure 6:
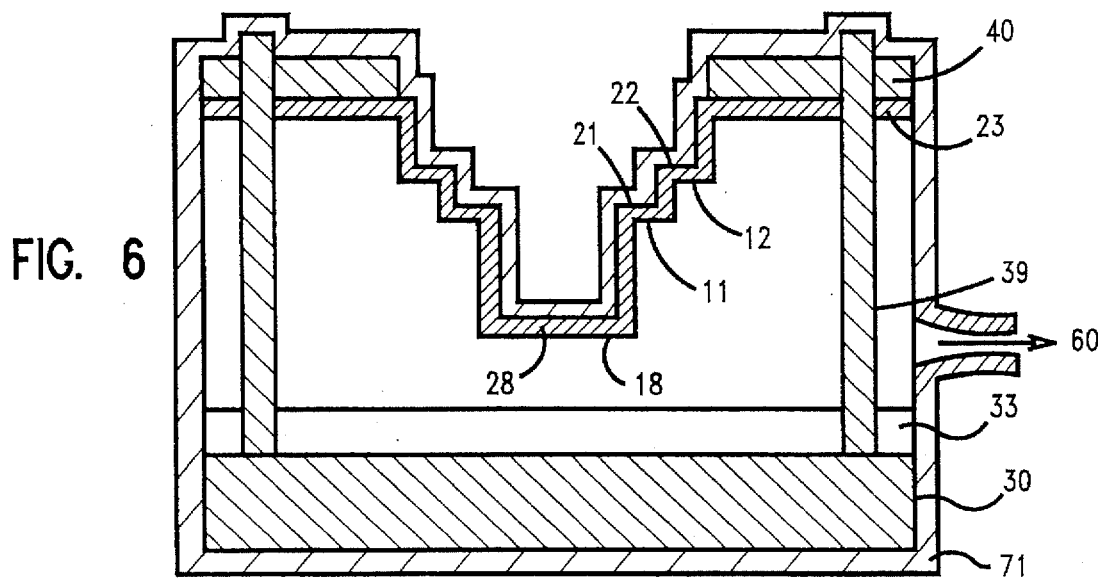
FIG. 6, illustrates a side view of yet another embodiment with the invention.

FIG. 6, illustrates a side view of yet another embodiment of the invention, where the port 60, has been connected to a vacuum port and the enclosure 61, has been forced to collapse, so that the surface of the enclosure 61, follows the surface contours of the enclosed assembly. This is a good example, where an external means, such as, the collapsed enclosure 61, could be used to protect the ceramic layers or module 10, from the degradation or interaction of the surrounding media.

After the apparatus of FIGS. 3, 4, 5 or 6, have been set-up, external pressure is applied to the ceramic layers of the module 10, through the first pressure plate 30, and the second pressure plate 40.

In order to prevent the cavity 15, from collapsing under this external pressure, a counter pressure could be applied inside the cavity 25. If a fluid, such as, air or water, was being used then the fluid would flow into the female portion of the insert 23, through the openings 45, in the upper laminate 40, and provide the desired counter pressure. However, an insert, such as, the solid insert 50, of FIG. 4, could also be used to provide the desired counter pressure. This counter pressure inside the cavity 25, should be almost equal to the mechanical pressure being applied to the ceramic sheets of the module 10, otherwise the cavity 25, will collapse if the external pressure is too high. However, if this counter pressure is too low then one would possibly have buckling or deformation of the cavity.

After the individual ceramic layers of the module 10, have been laminated to form the ceramic module or substrate 10, the apparatus is disassembled by removing the second pressure plate 40, and the insert 23.

The non-sticking material or membrane 33, can be gently peeled-off from the surface of the module 10. Basically, the module 10, could either be peeled-off from the non-sticky material 33, or the module 10, could be lifted from the first plate 30, and the non-sticky material or layer 33, could then be gently peeled-off from the module 10.

In practice, for the materials currently used to build ceramic modules 10, it is possible to maintain a pressure differential of less than 700 psi without observing deformation of the cavity.

For most applications, using ceramics, it is preferred that the pressure differential between the first platen and the second platen should be under about 700 psi, and more preferably between about 100 psi and about 200 psi.

Similarly, during the ramp down from the high platen pressure, the pressure of the gas has to be decreased simultaneously and proportionally, following the pressure-time path selected for the platen pressure.

At all times it is advantageous to maintain the pressure of the fluid into the cavity 25, lower than the pressure applied by the lamination platens 30 and/or 40, in order to minimize shearing or delamination of the green sheets of the module 10.

Typical fluids that are used to apply the pressure to the cavity 25, during the lamination process include, but are not limited to dry air, nitrogen, water. Typically, the fluid is selected from a group comprising air, helium, nitrogen, oxygen or any inert gas, water, to name a few. It should be understood that any fluid can be used for this pressurization or lamination process as long as the fluid does not interact or degrade the laminate. However, for applications where the module is being protected or shielded then it may not matter.

The preferred non-sticky material for the separator sheet 33, could be a polymer sheet material that has minimal or no affinity for the ceramic and metallurgical materials used to build the ceramic module 10. Some examples of non-sticky material suitable for the process described here are: polymers, such as, Mylar if rigidity and low elongation is required, or latex rubber, or polyethylene, etc., for high elongation cases. However, the at least one non-sticky material could be selected from a group comprising polymer, elastomer, Mylar, latex rubber, polyester, polyethylene, polyurethane, to name a few.

The preferred material for the preformed insert 23, could be a polymer sheet material that has minimal or no affinity for the ceramic and metallurgical materials used to build the ceramic module 10. Some examples of non-sticky material suitable for the process described here are: polymers, such as, Mylar if rigidity and low elongation is required, or latex rubber, or polyethylene, etc., for high elongation cases. However, at least one preformed insert material could be selected from a group comprising polymer, elastomer, Mylar, latex rubber, polyester, polyethylene, polyurethane, to name a few. It is also preferred that the modulus of this preformed insert is between 1 and 5 GPa, and preferably between 3 and 5 GPa.

EXAMPLES

The following examples are intended to further illustrate the invention and are not intended to limit the scope of the invention in any manner.

Example 1

Several samples of multi-layer ceramic substrates containing cavities were fabricated using the process of this invention. In one sample a stack of cavity containing blank ceramic layers were placed in a lamination frame, and the ceramic layers were separated from the bottom lamination plate by a layer of Mylar, and the top plate by a preform insert of this invention. The preform insert was made from a polyester material and it was about 5 mil thick. This polyester preform insert had an elongation of about 350 percent and a modulus of about 3.9 GPa. This assembly was then put in a commercially available polyolefin-polyester laminated bag and vacuum was created and the bag was heat sealed, which is similar to the embodiment illustrated in FIG. 6. The bag with the contents was then laminated under pressure and temperature in an isostatic press. After the lamination the ceramic substrate was then removed from the bag and inspected. It was found that the shelves in the cavity and the ceramic substrate had good dimensional control, i.e., the dimension after lamination were within the specifications.

Example 2

In another sample, an assembly of ceramic layers were stacked and laminated in a manner described in Example 1, but the preform insert of this invention was not used. This sample produced gross deformation of cavity shelves, similar to the ones as shown in FIG. 1, thus demonstrating the need for the process of this invention.

Example 3

In yet another sample an assembly of metallized ceramic layers containing a multi-step cavity design and the individual ceramic layers were stacked and placed in the lamination frame. This time the preform inserts used were made of (a) copolymers of polyethylene for some samples, (b) polyethyl naphthalate for some samples, and (c) kapton on other samples. The rest of the assembly and the procedure followed was similar to the one explained for Example 1. After the MLC had been laminated the MLC having the cavity was inspected. It was found that the laminated structure and the multi-step cavity dimensions were within the desired specifications.

Example 4

In yet another group of samples an assembly of ceramic layers were stacked and laminated in a manner described in Example 1, but a metal insert, as shown in FIG. 4, was inserted into the cavity, i.e., between the female portion of the preform insert and the top lamination plate. The lamination pressure applied was from a hydraulic press. After the MLC had been laminated the MLC having the cavity was inspected. The surface finish and the cleanliness of the metal insert used was purposely made sub-standard compared to when no preform inserts are used. In this situation since the surface of the metal insert itself does not touch the MLC, more economical solid inserts could be used. Furthermore, the quality of the MLC product is not dependent on the quality of the solid insert used due to this inventive preform insert process. It was also found that the solid insert placement was easy and accurate due to the presence of the preform insert. It was also found that cavity structure and dimensions were within the desired specification.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of forming a ceramic substrate having at least one cavity, comprising the steps of:
   (a) placing at least one ceramic layer having at least one cavity over a first plate, wherein said cavity forms a female portion in said ceramic layer,
   (b) placing at least one flexible preform insert having at least one cavity over said ceramic layer, wherein said cavity in said flexible preform insert forms a male portion and a female portion, such that the male portion of the flexible preform insert mates with the cavity of the ceramic layer and the surface of the male portion of said flexible preform insert follows the contours of at least a portion of said cavity of said ceramic layer,
   (c) placing a second plate having at least one opening over at least a portion of said at least one flexible preform insert,
   (d) pressurizing at least a portion of said second plate so that said first and second plates come closer and laminating said at least one ceramic layer, and whereas said male portion of said flexible preform insert prevents the collapse of the cavity of said ceramic layer, wherein said first plate, said at least one ceramic layer and said second plate are inside at least one environmental enclosure, and wherein said at least one environmental enclosure collapses and follows the contour of at least a portion of said ceramic substrate, and thereby forms a ceramic substrate having at least one cavity.

2. The method of claim 1, wherein a solid insert is inserted into the female portion of said preform insert.

3. The method of claim 1, wherein the material for said at least one preform insert is selected from a group consisting of elastomer, latex rubber, polyester, polyethylene and polyurethane.

4. The method of claim 1, wherein said at least one preform insert is a polymer.

5. The method of claim 1, wherein the modulus of said at least one preform insert is between about 1 and about 5 GPa.

6. The method of claim 1, wherein the modulus of said at least one preform insert is between about 3 and about 5 GPa.

7. The method of claim 1, wherein the material for said at least one ceramic layer is selected from a group consisting of alumina, alumina with glass frits, aluminum nitride, borosilicate and glass ceramic.

8. The method of claim 1, wherein the applied pressure between said first plate and said second plate is under about 700 psi.

9. The method of claim 1, wherein the applied pressure between said first plate and said second plate is between about 100 psi and about 200 psi.

10. The method of claim 1, wherein at least one non-sticky material is placed between said first plate and said at least one ceramic layer.

11. The method of claim 10, wherein said at least one non-sticky material is selected from a group consisting of elastomer, latex rubber, polyester, polyethylene and polyurethane.

12. The method of claim 10, wherein said at least one non-sticky material is a polymer.

13. The method of claim 1, wherein said pressurizing is selected from a group consisting of isostatic pressure and hydrodynamic pressure.

14. The method of claim 1, wherein said pressurizing is obtained from a fluid, and wherein said fluid is selected from a group consisting of air, nitrogen, oxygen, inert gas and water.

15. The method of claim 1, wherein said at least one ceramic layer is pre-heated prior to the application of said pressurizing.

16. An apparatus for forming cavities in at least one ceramic layer of a ceramic substrate comprising, a first plate to accommodate said at least one ceramic layer having at least one opening and said opening acting as a female portion, at least one flexible preform insert having at least one male portion, wherein said male portion of said flexible preform is inserted into at least a portion of said female portion of said at least one ceramic layer, a second plate having at least one opening over at least a portion of said at least one male portion of said flexible preform insert, at least one external pressure application means over said second plate, whereupon the application of at least one external pressure on said male portion prevents the collapse of said female portion in said substrate, wherein said first plate, said at least one ceramic layer and said second plate are inside at least one environmental enclosure, and wherein said at least one environmental enclosure collapses and follows the contour of at least a portion of said ceramic substrate, and thereby forms said at least one ceramic layer having at least on cavity.

17. The apparatus of claim 16, wherein said flexible preform insert accommodates a solid insert.

18. The apparatus of claim 16, wherein the material for said at least one preform insert is selected from a group consisting of elastomer, latex rubber, polyester, polyethylene and polyurethane.

19. The apparatus of claim 16, wherein said at least one preform insert is a polymer.

20. The apparatus of claim 16, wherein the modulus of said at least one preform insert is between about 1 and about 5 GPa.

21. The apparatus of claim 16, wherein the modulus of said at least one preform insert is between about 3 and about 5 GPa.

22. The apparatus of claim 16, wherein the material for said at least one ceramic layer is selected from a group consisting of alumina, alumina with glass frits, aluminum nitride, borosilicate and glass ceramic.

23. The apparatus of claim 16, wherein the applied pressure between said first plate and said second plate is under about 700 psi.

24. The apparatus of claim 16, wherein the applied pressure between said first plate and said second plate is between about 100 psi and about 200 psi.

25. The apparatus of claim 16, wherein at least one non-sticky material is between said first plate and said at least one ceramic layer.

26. The apparatus of claim 25, wherein said at least one non-sticky material is selected from a group consisting of elastomer, latex rubber, polyester, polyethylene and polyurethane.

27. The apparatus of claim 25, wherein said at least one non-sticky material is a polymer.

28. The apparatus of claim 16, wherein said at least one external pressure is selected from a group consisting of isostatic pressure and hydrodynamic pressure.

29. The apparatus of claim 16, wherein said external pressure is obtained from a fluid, and wherein said fluid is selected from a group consisting of air, nitrogen, oxygen, inert gas and water.

30. The apparatus of claim 16, wherein said at least one ceramic layer is exposed to heat prior to the application of said pressure.

* * * * *